United States Patent
Tanaka et al.

(10) Patent No.: US 6,508,473 B1
(45) Date of Patent: Jan. 21, 2003

(54) PISTON RING

(75) Inventors: Shoji Tanaka, Shiojiri (JP); Hiroto Fukutome, Chino (JP); Shinichi Imai, Shiojiri (JP)

(73) Assignee: Teikoku Piston Ring Co., Ltd., Tokyo (JP)

( * ) Notice: Subject to any disclaimer, the term of this patent is extended or adjusted under 35 U.S.C. 154(b) by 19 days.

(21) Appl. No.: 09/669,456

(22) Filed: Sep. 25, 2000

(51) Int. Cl.$^7$ ................................................ B60T 11/236
(52) U.S. Cl. ...................... 277/440; 277/441; 277/442; 277/443
(58) Field of Search .................... 277/434, 440, 277/442, 443, 444, 441

(56) References Cited

U.S. PATENT DOCUMENTS

| | | | |
|---|---|---|---|
| 2,905,512 A | * 9/1959 | Anderson | |
| 3,677,558 A | * 7/1972 | Sugahara | |
| 4,497,102 A | * 2/1985 | Ikutake | |
| 4,570,946 A | 2/1986 | Tsuchiya et al. | ............. 277/216 |
| 5,104,132 A | 4/1992 | Onoda et al. | ............. 277/235 A |
| 5,154,433 A | 10/1992 | Naruse | ................ 277/235 R |
| 5,241,748 A | * 9/1993 | Ishida | |
| 5,316,321 A | 5/1994 | Ishida et al. | ............. 277/235 A |
| 5,582,414 A | * 12/1996 | Miyazaki et al. | |
| 5,605,741 A | * 2/1997 | Hite et al. | |
| 5,655,955 A | * 8/1997 | Nagel et al. | |
| 5,960,762 A | 10/1999 | Imai | ............. 123/193.4 |
| 6,209,881 B1 | * 4/2001 | Michel et al. | |
| 6,279,913 B1 | * 8/2001 | Iwashita et al. | |
| 6,325,385 B1 | * 12/2001 | Iwashita et al. | |

FOREIGN PATENT DOCUMENTS

| | | | | |
|---|---|---|---|---|
| EP | 0 605 223 | 7/1994 | | |
| EP | 0 905 419 | 3/1999 | | |
| EP | 0 905 420 | 3/1999 | | |
| GB | 2 258 031 | 1/1993 | | |
| GB | 2 261 679 | 5/1993 | | |
| JP | 62-120471 | 6/1987 | | |
| JP | 362233458 A | * 10/1987 | ............. | F16J/9/26 |
| JP | 2-134468 | 5/1990 | | |
| JP | 404203677 A | * 7/1992 | ............. | F16J/9/26 |
| JP | 5-141534 | 6/1993 | | |
| JP | 5-172248 | 7/1993 | | |
| JP | 07004308 A | * 1/1995 | ............. | F02F/5/00 |
| JP | 9-96286 | 4/1997 | | |

OTHER PUBLICATIONS

Copy of Great Britain Patent Search Report for corresponding Great Britain patent application No. 0024087.9 dated Feb. 19, 2001.

* cited by examiner

*Primary Examiner*—Anthony Knight
*Assistant Examiner*—Vishal Patel
(74) *Attorney, Agent, or Firm*—Armstrong, Westerman & Hattori, LLP

(57) ABSTRACT

A piston ring is made of martensitic stainless steel. Except for the outer circumferential surface of the piston ring, a nitrided layer having a Vickers hardness of 700 or more is formed on the upper and lower surfaces and inner circumferential surface, and a nitrided layer having a Vickers hardness of less than 700 is formed below the nitrided layer. A hard film is then formed by ion plating only on the outer circumferential surface of the piston ring. The hard film formed by ion plating and the nitrided layer with a Vickers hardness of 700 or more are separated without making contact in the vicinity of at least one of corner sections formed by the upper and lower surfaces and outer circumferential surface. The distance is within a range of 0.001 to 0.3 mm. The nitrided layers can be formed just on the upper and lower surfaces of the piston ring.

16 Claims, 5 Drawing Sheets

F I G. 2A
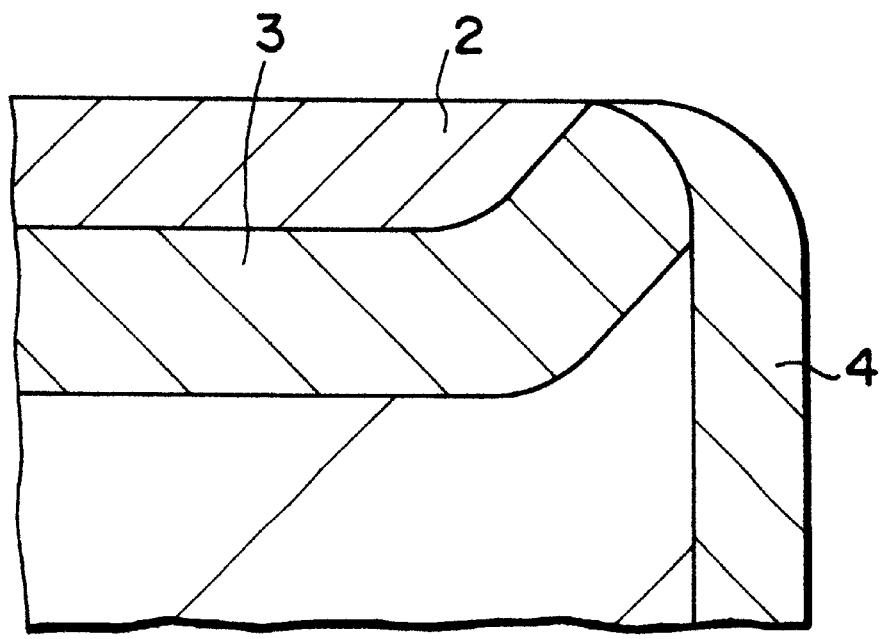
F I G. 2B
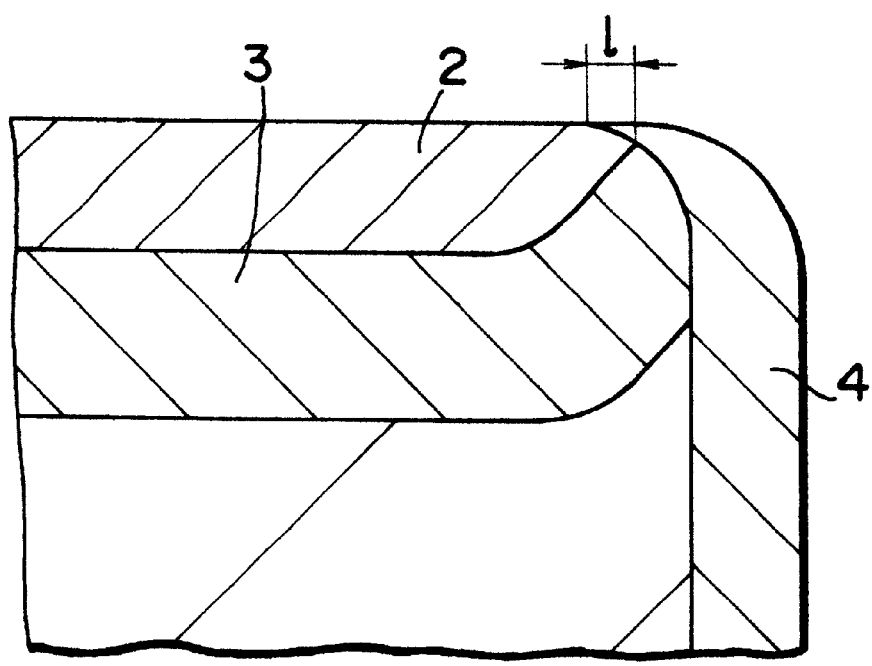

ns
PISTON RING

BACKGROUND OF THE INVENTION

1. Field of the Invention

The present invention relates to piston rings mounted in pistons of internal combustion engines.

2. Description of the Related Art

In recent years, the operating environment of the piston ring has become more severe along with exhaust emission regulations and demands for higher engine output. In piston rings in particular, having a hard film to improve durability formed by ion plating over a nitrided base material of martensitic stainless steel, the problem of a drop in fatigue strength occurs. As a countermeasure, the Japanese Patent Laid-open No. 5-172248 and Japanese Patent Publication No. 6-25597 (Japanese Patent Laid-open No. 62-120471) disclose a piston ring forming a nitrided layer only on the upper and lower surfaces and inner circumferential surface of a steel piston ring and covering the outer circumferential surface with a hard film by ion plating. However, these official gazettes mention nothing of a hard film formed by ion plating and nitrided layer not in contact with each other in the vicinity of the corners formed by the upper and lower surfaces and outer circumferential surface of the piston ring.

The above-mentioned piston rings of the known art have been designated as having insufficient fatigue strength under severe engine operating conditions.

SUMMARY OF THE INVENTION

The present invention is a piston ring formed with a nitrided layer on upper and lower surfaces or upper and lower surfaces and an inner circumferential surface of the piston ring, and formed with a hard film by ion plating on an outer circumferential surface of the piston ring, wherein the nitrided layer has a Vickers hardness of 700 or more on at least one of the upper and lower surfaces and the hard film formed by ion plating on the outer circumferential surface are separated and are not in contact with each other.

Piston rings under harsh engine operating conditions are subjected in particular to bending stresses. This bending stress is applied in particular to the comer sections on the outer circumferential side of the piston ring. In an engine with high combustion pressure, a load is applied to the corner section on the lower surface side of the piston ring, and in an engine at high speed, a load is applied to the corner section on the upper surface side of the piston ring due to the occurrence of fluttering. However, this load can be alleviated by setting a nitrided layer with a Vickers hardness of 700 or more and a hard film formed by ion plating not in contact with each other, on at least one side of the upper and lower surfaces in the corner sections on the outer circumferential side of the piston ring, and a piston ring with improved fatigue strength can be obtained. Which side is chosen between the upper and lower surfaces in the corner sections of the outer circumferential side of the piston ring as the side where the nitrided layer with a Vickers hardness of 700 or more and the hard film formed by ion plating do not make contact, varies according to the type of engine, however, it is preferable not to make contact on both sides of the upper and lower surfaces.

The distance between the nitrided layer with a Vickers hardness of 700 or more and the hard film formed by ion plating is preferably 0.001 mm or more for improved fatigue strength and preferably 0.3 mm or less for good wear resistance. When this distance is larger, the wear on this portion increases, so a distance of 0.001 to 0.1 mm is even more preferable.

The material of the piston ring is preferably martensitic stainless steel.

The nitrided layer is formed by a method such as gas nitriding or salt bath softnitriding. The nitrided layer is preferably formed by the salt bath softnitriding method in order to minimize deformation of the ring. The nitrided layer with a Vickers hardness of 700 or more preferably has a thickness in a range from 1 to 110 $\mu$m. Ring deformation increases as the nitrided layer becomes thicker and ring wear on the upper and lower surfaces increases as the nitrided layer becomes thinner, so the nitrided layer with a thickness in a range from 3 to 40 $\mu$m is even more preferable.

The hard film formed by ion plating is comprised of a CrN, $Cr_2N$, mixture of CrN and $Cr_2N$, mixture of Cr and either or both of CrN and $Cr_2N$, or TiN, etc. At least one of oxygen and carbon is preferably contained in a solid solution state in the crystal of the film.

The thickness of the hard film formed by ion plating is preferably within a range from 1 to 80 $\mu$m.

BRIEF DESCRIPTION OF THE DRAWINGS

FIG. 2A is a vertical cross-sectional view of a portion of the piston ring before grinding of the upper and lower surfaces when the hard film formed by ion plating is in contact with the nitrided layer having a Vickers hardness of 700 or more.

FIG. 2B is a vertical cross-sectional view of a portion of the piston ring before grinding of the upper and lower surfaces when the hard film formed by ion plating and the nitrided layer having a Vickers hardness of 700 or more are overlapped.

DESCRIPTION OF THE PREFERRED EMBODIMENTS

The preferred embodiments of the present invention are hereafter described while referring to the accompanying drawings.

Figure 1A:
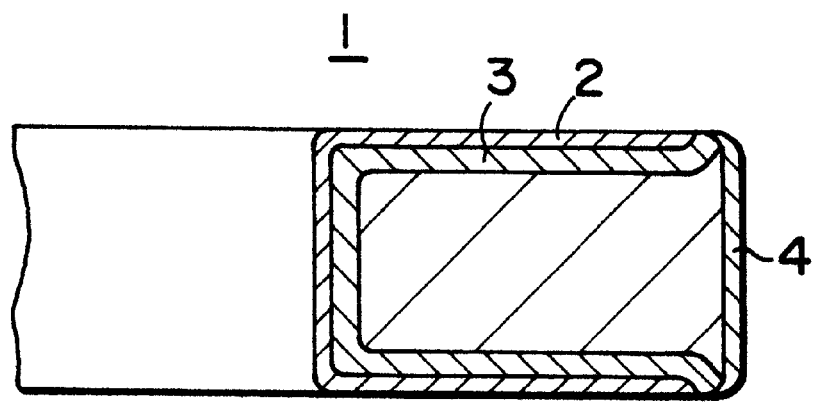
FIG. 1A is a vertical cross-sectional view showing a portion of the piston ring of the preferred embodiment of the present invention.
Figure 1B:
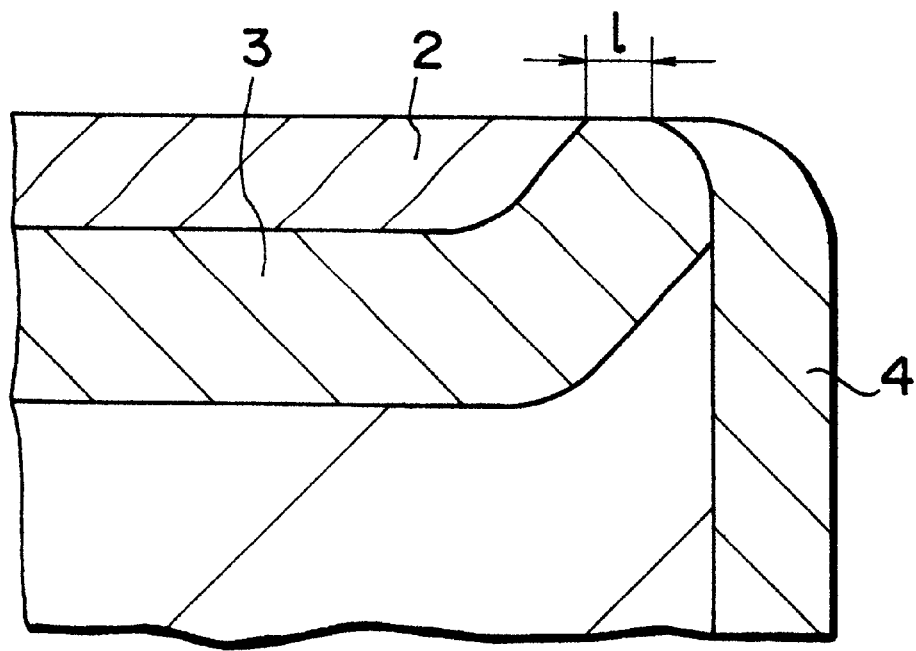
FIG. 1B is an enlarged view of a portion of FIG. 1A.

The first embodiment of the present invention is shown in FIG. 1A and FIG. 1B. A piston ring 1 in FIG. 1A is made of martensitic stainless steel. Excluding the outer circumferential surface, the upper and lower surfaces and inner circumferential surface of the piston ring 1 are formed with a nitrided layer 2 having a Vickers hardness 700 or more, and a nitrided layer 3 having a Vickers hardness of less than 700 is formed below the nitrided layer 2. A hard film 4 made by ion plating is then formed only on the outer circumferential surface of the piston ring 1. The hard film 4 formed by ion plating is, for instance, comprised of CrN, with a film thickness in a range from 1 to 80 $\mu$m. The thickness of the nitrided layer 2 having a Vickers hardness of 700 or more is within a range of 1 to 110 $\mu$m.

The nitrided layer 2 with a Vickers hardness of 700 or more and the hard film 4 formed by ion plating do not make contact and are formed separate from each other in the vicinity of the corner sections formed by the upper and lower surfaces and outer circumferential surface. The upper surface side is typically shown in FIG. 1B, however, the lower surface side is also formed in the same way. The distance between the nitrided layer 2 with a Vickers hardness of 700 or more and the hard film 4 formed by ion plating is within a range from 0.001 to 0.3 mm.

The process for manufacturing the piston ring 1 is described next.

The piston ring 1 is subjected to ion plating, then nitriding, and grinding of the upper and lower surfaces afterwards.

(1) Method for Forming the Hard Film by Ion Plating

After washing the piston ring with ultrasonic waves in acetone, the piston ring is set inside the furnace of the arc ion plating apparatus and a vacuum is produced. After evacuating the air to create an internal furnace pressure within $1\times10^{-3}$ Pa, the piston ring is heated to a range of 493 to 723 K (absolute temperature) with a sheath heater. Immediately after heating, a gas is emitted that adheres to the piston ring and the internal furnace pressure rises but the pressure once again drops. After the pressure drops below $5\times10^{-3}$ Pa, a bias voltage of –800 to –1000 volts is applied to the piston ring and a vacuum arc discharge is generated across the chromium target of the cathode and the anode, and the chromium is vaporized and ionized. Nitrogen gas constituting the process gas is supplied, and metal ion bombardment is performed. After 10 minutes of metal ion bombardment, nitrogen gas is supplied until the pressure reaches $4\times10^{-1}$ to 1.5 Pa, and a bias voltage of –20 to –70 volts is applied, and CrN is deposited for a specified time to form the CrN film.

In the process for having at least one of oxygen and carbon contained in a solid solution state in the crystal of the film, the following process gas may be used. A gas mixture of oxygen gas and nitrogen gas may be used as the process gas to contain only oxygen in a solid solution state. In order to contain only carbon in a solid solution state, a gas mixture containing nitrogen gas and at least one type from among $CH_4$, $C_2H_4$ and $C_2H_2$ gas may be used as the process gas. In order to contain both oxygen and carbon in a solid solution state, a gas mixture containing nitrogen gas and oxygen gas and at least one type from among $CH_4$, $C_2H_4$ and $C_2H_2$ gas may be used as the process gas.

When the portion where the hard film formed by ion plating contacts the stainless steel is made to have a low porosity, this low porosity inhibits nitriding in the stainless steel below the hard film formed by ion plating, during the nitriding process described later, and good adhesion can be maintained in the hard film formed by ion plating.

(2) Nitriding Process

The nitriding process is performed by the gas nitriding method or the salt bath softnitriding method. Vertical cross-sectional views of a portion of the piston ring after the nitriding process are shown in FIG. 2A and FIG. 2B. The reference numeral 2 in the figures denotes the nitrided layer having a Vickers hardness of 700 or more formed only on the upper and lower surfaces and inner circumferential surface of the piston ring 1, reference numeral 3 denotes the nitrided layer having a Vickers hardness of less than 700 formed below the nitrided layer 2, reference numeral 4 denotes the hard film (CrN film) formed by ion plating covering only the outer circumferential surface of the piston ring 1. The example in FIG. 2A shows the nitrided layer 2 with a Vickers hardness of 700 or more and the hard film (CrN film) 4 making contact in the vicinity of the corners formed by the upper and lower surfaces and outer circumferential surface. The example in FIG. 2B shows the nitrided layer 2 with a Vickers hardness of 700 or more and the hard film (CrN film) 4 overlapping in the vicinity of the corners formed by the upper and lower surfaces and outer circumferential surface.

(3) Grinding of the Upper and Lower Surfaces

After the nitriding process, grinding of the respective upper and lower surfaces of the piston ring 1 is performed and as shown in FIG. 1A and FIG. 1B, the nitrided layer 2 with a Vickers hardness of 700 or more and the hard film 4 formed by ion plating are formed without making contact, in the vicinity of the corners formed by the upper and lower surfaces and outer circumferential surface and are separated. The examples in FIG. 1A and FIG. 1B show the nitrided layer 2 with a Vickers hardness of 700 or more on the upper and lower surfaces and the hard film 4 formed by ion plating on the outer circumferential surface which are not in contact and formed separate from each other. However, depending on the engine, the piston ring may have a structure where the nitrided layer 2 with a Vickers hardness of 700 or more on one of the upper and lower surfaces and the hard film 4 formed by ion plating on the outer circumferential surface do not make mutual contact. By adjusting the amount ground from the respective upper and lower surfaces, the nitrided layer 2 and the hard film 4 can be formed not to make contact with each other, in the vicinity of the corner on at least one of the upper and lower surfaces.

The following method can be utilized to determine if the nitrided layer 2 with a Vickers hardness of 700 or more and the hard film 4 formed by ion plating are not making contact at the vicinity of the corners formed by the upper and lower surfaces and outer circumferential surface.

When a cross section of the piston ring 1 is etched by using a corrosive agent called nital, the nitrided layer 2 with a Vickers hardness of 700 or more and the nitrided layer 3 with a Vickers hardness of less than 700 corrode differently. Therefore, viewing the vicinity of the corner formed by the upper and lower surfaces and outer circumferential surface of the piston ring 1 with a microscope reveals that the nitrided layer 2 with a Vickers hardness of 700 or more and the hard film 4 formed by ion plating are separated. The distance between the nitrided layer 2 and the hard film 4 can be measured. Nital is a corrosive agent comprised of 5 percent nitric acid by volume and 95 percent ethyl alcohol or methyl alcohol by volume.

Figure 3A:
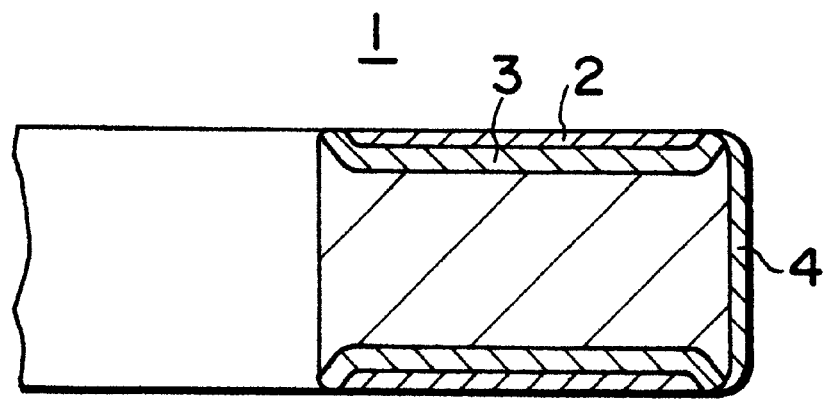
FIG. 3A is a vertical cross-sectional view showing a portion of the piston ring of another preferred embodiment of the present invention.
Figure 3B:
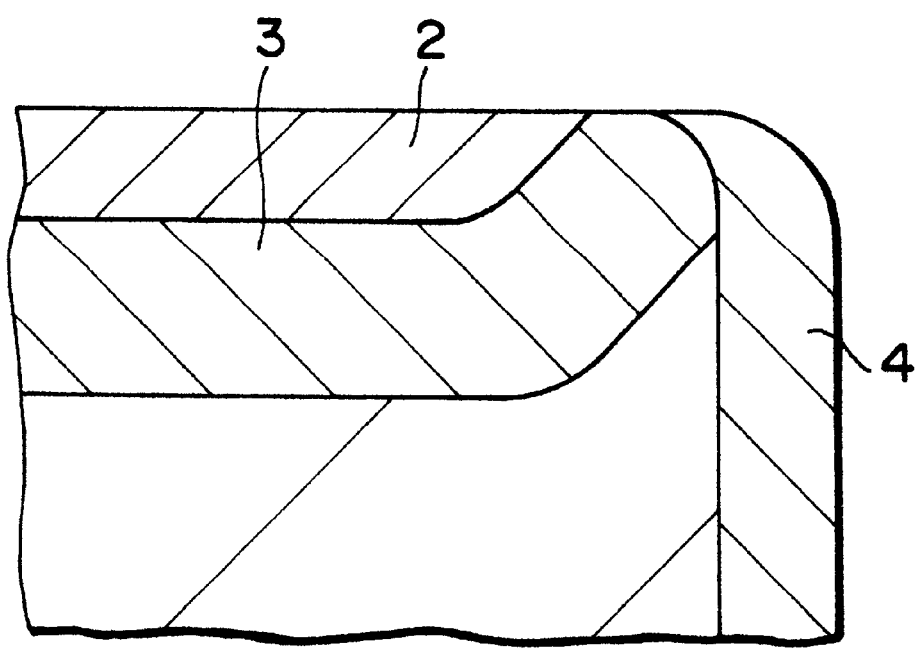
FIG. 3B is an enlarged view of a portion of FIG. 3A.

Another embodiment of the present invention is shown in FIG. 3A and FIG. 3B. The point of difference of this embodiment from the above embodiment is only the portion where the nitrided layers 2 and 3 are formed. In other points, the piston ring has the same structure as the above described embodiment. In other words, except for the outer circumferential surface and the inner circumferential surface, the upper and lower surfaces of the piston ring 1 are formed with the nitrided layer 2 with a Vickers hardness of 700 or more, and the nitrided layer 3 with a Vickers hardness of less than 700 is formed below the nitrided layer 2. The hard film 4 is formed by ion plating only on the outer circumferential surface of the piston ring 1.

The results of the fatigue tests performed on the piston ring of the present invention are explained next.

Figure 4:
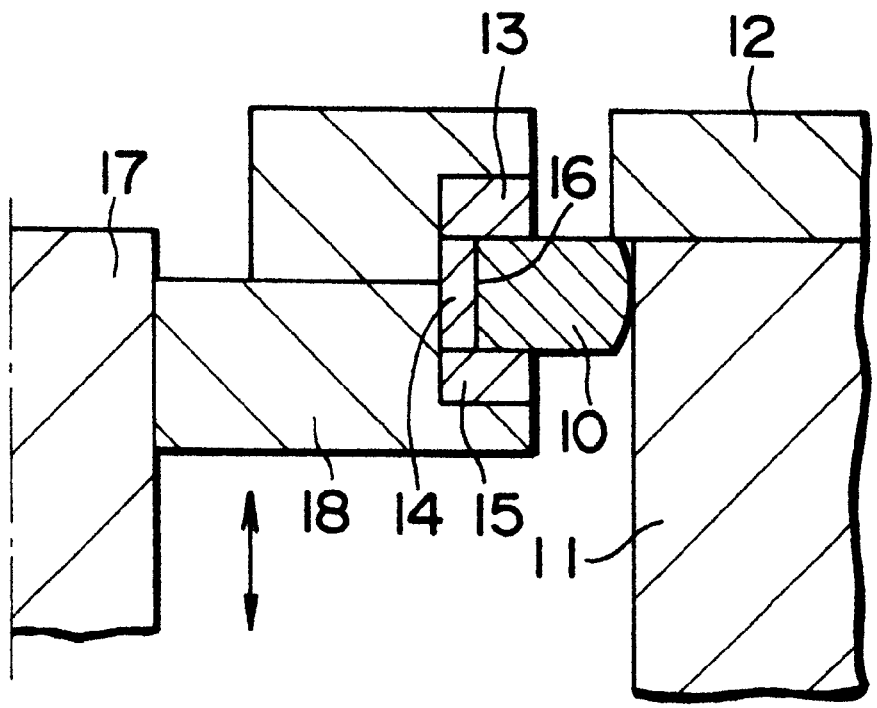
FIG. 4 is a vertical cross-sectional view showing the structure of the torsion fatigue testing machine.

Fatigue tests on the piston rings shown in Table 1 were performed using the torsion fatigue testing machine shown in FIG. 4.

TABLE 1

| | Nitriding process | Distance between hard film formed by ion plating and nitrided layer with a Vickers hardness of 700 or more in vicinity of corners formed by upper/lower surfaces and outer circumferential surface (mm) | | Nitrided surface | Hard film formed by ion plating |
|---|---|---|---|---|---|
| | | Upper surface | Lower surface | | |
| Comparative Example | | | | | |
| 1 | Gas nitriding | -0.1~ -0.08 | -0.12~ -0.05 | Upper/lower surfaces | CrN |
| 2 | Salt bath softnitriding | -0.02~ -0.003 | -0.025~ -0.01 | Upper/lower surfaces & inner circumferential surface | CrN |
| 3 | Gas nitriding | 0 | -0.014~ -0.008 | Upper/lower surfaces & inner circumferential surface | CrN |
| 4 | Salt bath softnitriding | 0 | 0 | Upper/lower surfaces & inner circumferential surface | CrN |
| 5 | Gas nitriding | -0.006~ -0.001 | 0 | Upper/lower surfaces | CrN |
| Embodiment | | | | | |
| 1 | Salt bath softnitriding | -0.03~ -0.008 | 0.001~ 0.02 | Upper/lower surfaces & inner circumferential surface | CrN |
| 2 | Gas nitriding | 0.05~ 0.07 | -0.04~ -0.015 | Upper/lower surfaces | CrN |
| 3 | Salt bath softnitriding | 0.25~ 0.3 | 0.15~ 0.22 | Upper/lower surfaces & inner circumferential surface | CrN |

Notes in Table 1:
(1) A plus numerical value in the distance box indicates that the nitrided layer and the hard film are separated from each other and indicates the distance 1 (See FIG. 1B). A numerical value of 0 in the distance box indicates that the hard film formed by ion plating and the nitrided layer are contacting each other. A minus numerical value in the distance box indicates that the hard film formed by ion plating and the nitrided layer are overlapped and indicates the overlapping length 1 (See FIG. 2B).
(2) The thickness of the hard film formed by ion plating is all 30 μm, having the same film characteristics.
(3) The base material of the piston ring is all 17 Cr martensitic stainless steel.
(4) Nitriding of all piston rings was performed after ion plating.
(5) Piston rings dimensions: Ø88×axial width 1.5 mm×radial length 2.5 mm The structure of the torsion fatigue testing machine is shown in FIG. 4. The torsion fatigue testing machine has a cylinder 11 having the same inner diameter as the nominal size of a piston ring 10 to be tested, and having a clamp plate 12 fastened to the upper surface of the cylinder 11. The clamp plate 12 has an inner diameter smaller than the nominal size of the piston ring 10 to be tested, and functions to depress the upper surface of the outer circumferential side of the piston ring 10 placed within the cylinder 11. The upper and lower surfaces on the inner circumferential side of the piston ring 10 placed within the cylinder 11, are inserted within and supported by an annular groove 16 comprised of holders 13, 14, and 15. The holders 13, 14, and 15 are secured to a holder clamping member 18 fastened to a shaft 17. The shaft 17 is configured to move up and down by a hydraulic cylinder not shown in the drawing. Therefore, when the shaft 17 moves up and down, the outer circumferential side of the piston ring 10 remains clamped by the clamp plate 12, and the inner circumferential side of the piston ring 10 moves up and down so that a torsion stress is applied to the corner section of the piston ring 10.

Test conditions: A torsion stress was applied to the corner section of the piston ring 10 while the mating ends of the piston ring 10 were closed, and the number of cycles when the piston ring 10 broke was measured. The torsion stress on the corner section of the piston ring 10 was made to change by changing the amount of displacement on the inner circumferential side of the piston ring 10.

Revolutions: 3500 rpm

Displacement: 0.1 to 0.6 mm

Figure 5:
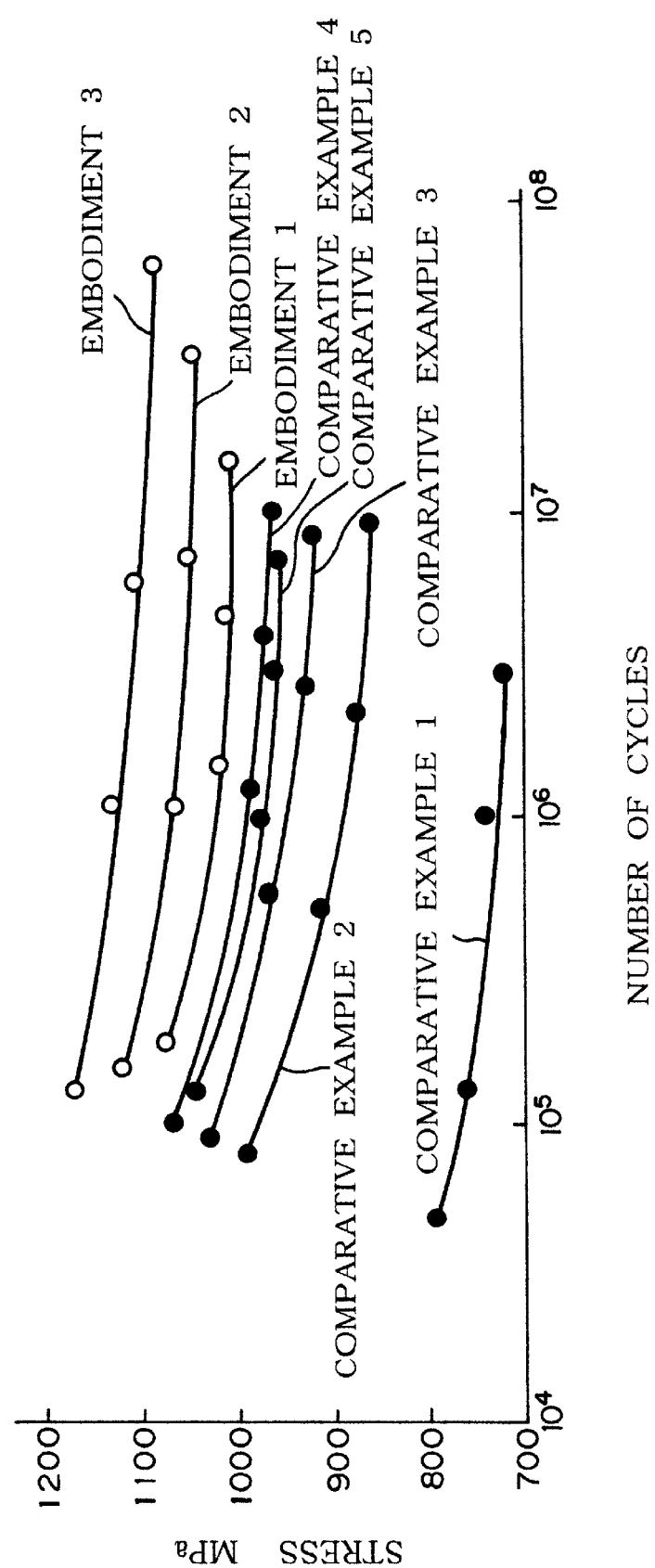
FIG. 5 is a graph showing the results of the fatigue test.

As shown by the results of the test of FIG. 5, the comparative examples 1 through 5 have low breakage strength, while the embodiments 1 through 3 have high breakage strength.

Although the present invention has been described with reference to the preferred embodiments, it is apparent that the present invention is not limited to the aforesaid preferred embodiments, but various modification can be attained without departing from its scope.

What is claimed is:

1. A piston ring with a nitrided layer on upper and lower surfaces, or on upper and lower surfaces and an inner circumferential surface, of said piston ring, and formed with a hard film by ion plating on an outer circumferential surface and corners formed by the upper and lower surfaces and outer circumferential surface of said piston ring, wherein said nitrided layer having a Vickers hardness of 700 or more is formed on at least one of a portion of said upper and lower surfaces such that said nitrided layer having a Vicker s hardness of 700 or more and said hard film formed by ion plating on said outer circumferential surface and said corners are separated and are not in contact with each other, and wherein a distance between said nitrided layer having a Vickers hardness of 700 or more and said hard film formed by ion plating is within a range from 0.001 to 0.3 mm.

2. A piston ring as claimed in claim 1, wherein a thickness of said nitrided layer having a Vickers hardness of 700 or more is within a range from 1 to 110 μm.

3. A piston ring as claimed in claim 1, wherein a thickness of said nitrided layer having a Vickers hardness of 700 or more is within a range from 3 to 40 μm.

4. A piston ring as claimed in claim 1, wherein said nitrided layer is a softnitrided layer.

5. A piston ring as claimed in claim 1, wherein said piston ring is made of martensitic stainless steel.

6. A piston ring as claimed in claim 1, wherein said hard film formed by ion plating is comprised of a CrN, $Cr_2N$, mixture of CrN and $Cr_2N$, mixture of Cr and either or both of CrN and $Cr_2N$, or TiN.

7. A piston ring as claimed in claim 6, wherein at least one of oxygen and carbon is contained in a solid solution state in a crystal of said hard film formed by ion plating.

8. A piston ring as claimed in claim 1, wherein a thickness of said hard film formed by ion plating is within a range from 1 to 80 μm.

9. A piston ring with a nitrided layer on upper and lower surfaces, or on upper and lower surfaces and an inner circumferential surface, of said piston ring, and formed with a hard film by ion plating on an outer circumferential surface and corners formed by the upper and lower surfaces and outer circumferential surface of said piston ring,
wherein said nitrided layer having a Vickers hardness of 700 or more is formed on at least one of a portion of said upper and lower surfaces such that said nitrided layer having a Vickers hardness of 700 or more and said hard film formed by ion plating on said outer circumferential surface and said corners are separated and are not in contact with each other, and
wherein a distance between said nitrided layer having a Vickers hardness of 700 or more and said hard film formed by ion plating is within a range from 0.001 to 0.1 mm.

10. A piston ring as claimed in claim 9, wherein a thickness of said nitrided layer having a Vickers hardness of 700 or more is within a range of 1 to 110 μm.

11. A piston ring as claimed in claim 9, wherein a thickness of said nitrided layer has a Vickers hardness of 700 or more is within a range of 3 to 40 μm.

12. A piston ring as claimed in claim 9, wherein said nitrided layer is a softnitrided layer.

13. A piston ring as claimed in claim 9, wherein said piston ring is made of martensitic stainless steel.

14. A piston ring as claimed in claim 9, wherein said hard film formed by ion plating is comprised of a CrN, $Cr_2N$, mixture of CrN and $Cr_2N$, mixture of Cr and either or both of CrN and $Cr_2N$, or TiN.

15. A piston ring as claimed in claim 9, wherein a thickness of said hard film formed by ion plating is within a range of 1 to 80 μm.

16. A piston ring as claimed in claim 14, wherein at least one of oxygen and carbon is contained in a solid solution state in a crystal of said hard film formed by ion plating.

* * * * *